United States Patent
Kai et al.

(10) Patent No.: US 6,446,159 B2
(45) Date of Patent: *Sep. 3, 2002

(54) SEMICONDUCTOR CIRCUIT AND METHOD OF CONTROLLING THE SAME

(75) Inventors: Koji Kai, Fukuoka; Taku Ohsawa, Sagamihara; Kazuaki Murakami, Kasuga, all of (JP)

(73) Assignee: Matsushita Electric Industrial Co., Ltd., Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/242,049

(22) PCT Filed: Jun. 8, 1998

(86) PCT No.: PCT/JP98/02543

§ 371 (c)(1),
(2), (4) Date: Feb. 8, 1999

(87) PCT Pub. No.: WO98/57332

PCT Pub. Date: Dec. 17, 1998

(30) Foreign Application Priority Data

Jun. 12, 1997 (JP) .............................. 9-155125

(51) Int. Cl.$^7$ .............................................. G06F 12/00
(52) U.S. Cl. ....................................... 711/106; 365/222
(58) Field of Search ................................ 711/105, 106; 365/222

(56) References Cited

U.S. PATENT DOCUMENTS

| | | | | | |
|---|---|---|---|---|---|
| 4,172,282 A | * | 10/1979 | Aichelmann, Jr. et al. | | |
| 4,920,489 A | * | 4/1990 | Hubelbank et al. | .......... | 128/702 |
| 5,276,843 A | * | 1/1994 | Tillinghast et al. | .......... | 711/105 |
| 5,907,857 A | * | 5/1999 | Biswas | ....................... | 711/106 |
| 5,959,923 A | * | 9/1999 | Matteson et al. | ........... | 365/222 |
| 5,966,725 A | * | 10/1999 | Tabo | .......................... | 711/106 |
| 6,085,283 A | * | 7/2000 | Toda | .......................... | 711/104 |
| 6,094,704 A | * | 7/2000 | Martin et al. | ................ | 711/105 |

FOREIGN PATENT DOCUMENTS

| | | |
|---|---|---|
| JP | 1-290193 | 11/1989 |
| JP | 5-242671 | 9/1993 |
| JP | 6-089571 | 3/1994 |

* cited by examiner

Primary Examiner—Matthew Kim
Assistant Examiner—C. P. Chace
(74) Attorney, Agent, or Firm—Jordan & Hamburg LLP (57) ABSTRACT

An object of the invention, in a semiconductor circuit or, more particularly, in an LSI on which a DRAM and a logic circuit are merged, is to decrease the frequency of times of refreshing operations to thereby achieve both reduction in power consumption and prevention of deterioration in the performance of the logic circuit caused by an increase in the memory access time due to contention between refresh and DRAM access of the logic circuit.

To achieve the object, the refreshing is done only for rows storing the data used by the logic portion.

Further, arbitrary data for which periods from being written in to being read out are overlapping or close to each other are allocated to the same row of the DRAM so as to be stored thereon, and the row is refreshed only during the period of time that the data stored thereon is live.

10 Claims, 11 Drawing Sheets

MEMORY ALLOCATION BY COMPILER (FIRST EMBODIMENT)

FIG. 6

MEMORY ALLOCATION BY OPERATING SYSTEM (FIRST EMBODIMENT)

LIFETIME OF EACH DATA (b)

(c)

LIFETIME OF DATA ON EACH ROW (d)

DISPOSITION ON MEMORY

(e)

LIFETIME OF DATA ON EACH ROW

MEMORY ALLOCATION BY COMPILER (THIRD EMBODIMENT)

FIG. 12

MEMORY ALLOCATION BY OPERATING SYSTEM (THIRD EMBODIMENT)

FIG. 13

MEMORY ALLOCATION BY COMPILER (FOURTH EMBODIMENT)

FIG. 14

SEMICONDUCTOR CIRCUIT AND METHOD OF CONTROLLING THE SAME

TECHNICAL FIELD

The invention relates to a semiconductor circuit and a control method thereof and more particularly to a semiconductor circuit and a control method thereof wherein the interval between refreshing operations of a DRAM is prolonged.

BACKGROUND ART

With the progress in the integration of semiconductors, it has become possible to integrate a processor, a memory, or other circuit onto one chip. Further, with the progress in the technology of processes enabling a logic circuit such as a processor and DRAM (Dynamic RAM) to be merged on one chip, it has become possible to implement DRAM on a memory.

Each memory cell of DRAM is small, and made of a capacitor. Their advantage over the implementing of SRAM (Static RAM) is that the chip area can be greatly reduced. On the other hand, they bring such a disadvantage in that the electric charge stored thereon as data discharges with the passage of time and, hence, the data is lost. Therefore, it is necessary to make an operation to keep data from being lost. The memory cells of DRAM in general are arranged in a matrix array. The data stored in the memory cells are read out all at once for each row, detected by a sense amplifier, and the values of the data read out are written into the memory cells from which the data were read out. Such a sequence of operations is called "refresh".

During the refreshing operation, the DRAM does not accept any access to itself. In the normal mode which allows read/write from outside the DRAM, the refreshing operation is executed by a DRAM controller outside the DRAM, but in a sleeping mode such as when backed up by battery, the refreshing operation is performed by a refresh controller inside the DRAM LSI. In the sleeping mode, any read/write access from outside the DRAM is not accepted.

Here, some problems arise when the DRAM and logic circuit are merged on the same LSI.

Merged DRAM/logic LSIs, however, have some disadvantages such that the DRAM portion of merged DRAM/logic LSIs might suffer from shorter data retention time. Heat and noise dissipated by the logic portion on the same chip could be harmful to the data retention time of the one-tip DRAM. When the ambient temperature rises, for example, from 25° C. to 70° C., the leakage current of the charge stored on the memory cell of the DRAM is increased by 30 fold and, hence, it becomes necessary to carry out the refreshing operation 30 times more frequently (Ito, "VLSI Memory Design", Baifukan). In a system using conventional DRAM, refreshing operations are made at short intervals assuming the worst operating environmental conditions. Therefore, under normal temperature conditions, refreshing operations are being made at a great frequency.

There is great variation of the data retention time among the memory cells of DRAM and few memory cells have short data retention times (Iwata et al. "Circuit Techniques for Super Low Retention Current DRAM", Technical Report of Institute of Electronics, Information, and Communication Engineers, ICD 95-50). However, refreshing operations are being made at the same cycle time for all of the rows. This means that refreshing operations are being made at a greater frequency than is needed for many of the rows, often including no memory cells that have a small actual capacity in terms of data retention time.

Further, all of the rows are refreshed whether the data held in DRAM are necessary for the logic circuit or not. In reality, only necessary data need be held in memory and, hence, unnecessary data need not be refreshed.

Such excessive refreshing invites wasteful power consumption.

Under these circumstances, means for decreasing the frequency of refreshing operations are being investigated. As a technique to decrease power consumption in the data retention mode of a conventional DRAM, there is a method 1 in which self-refreshing is conducted at a refreshing cycle time corresponding to temperature (Japanese Patent Laid-Open No. 6-215561). Further, as a technique to decrease power consumption in the normal mode of a conventional DRAM, there is a method 2 in which a control for the power supply and the decision as to whether a refreshing operation should be carried out is executed according to a flag set up in each memory area (Japanese Patent Laid-Open No. 5-324140, U.S. Pat. No. 5,469,559).

However, in Method 1 above, since the refreshing cycle time in the normal mode is adjusted to the memory cell having the shortest data retention time in the DRAM, there still remains the unresolved problem of power consumption in the normal mode. Further, Method 2 does not cope with variations in the data retention time.

What is more important is that the merged DRAM/logic LSI has a connection at a wide memory band width to achieve highly improved processing performance of the logic portion. In such an LSI, there arises a problem of conflict between refresh and access to the DRAM made by the logic circuit, thereby prolonging the time required for DRAM access and, hence, the processing performance of the logic circuit is deteriorated. This is a serious problem, comparable with the problem of achieving reduction in power consumption.

The first object of the present invention, in a semiconductor circuit or, more particularly, in an LSI on which a DRAM and a logic circuit are merged, is to decrease the number of refreshing operations by refreshing only the rows storing necessary data, and thereby achieve both reduction in power consumption and prevention of deterioration in the performance of the logic circuit caused by an increase in the access time due to the confliction between refresh and access to the DRAM.

A second object of the invention is to determine the rows storing data thereon according to the degree of importance of the data to, thereby, ensure saving important data without excessively shortening the refresh cycle time.

A third object of the invention is to have refreshing operations carried out at suitable cycle time in conformity with the temperatures to thereby achieve both reduction in power consumption and prevention of deterioration in the processing performance of the logic circuit.

DISCLOSURE OF THE INVENTION

In order to achieve the first object, the invention, in a control method of a merged DRAM/logic LSI, is characterized by comprising the steps of disposing data, which are combined so that the number of the rows storing data thereon may be reduced, on each of the rows of the DRAM and refreshing each of the rows having data stored thereon.

Another method to achieve the first object, in a control method of a merged DRAM/logic LSI, is characterized by comprising the steps of disposing arbitrary data of which periods from being written in to being read out are overlapping or close to each other are disposed on the same row of the DRAM and refreshing the row only during the time period from the writing in of the data at the first to the reading out thereof at the end.

A method to achieve the first and the second objects, in a control method of a merged DRAM/logic LSI, comprises the steps of obtaining the memory capacity required by an application using DRAM and storing data in DRAM in order from a row having a longer data retention time, with reference made to a table storing previously obtained data retention time of each row of DRAM, and setting a refreshing cycle adapted to the row whose data retention time is the shortest of the rows storing data thereon.

In this method, data may be disposed, when it is stored in the DRAM, on specific rows in accordance with the importance of the data.

A method to achieve the third object, in each of the above methods, is characterized by comprising the step of detecting the temperature of the semiconductor circuit and setting the refreshing cycle time of the DRAM according on the temperature.

A semiconductor circuit to achieve the first object is characterized by comprising means for disposing data, which are combined so that the number of the rows storing the data thereon may be reduced, on each of the rows of the DRAM and means for refreshing each of the rows having the data stored thereon.

Another semiconductor circuit which has achieved the first object is characterized by comprising means for disposing arbitrary data of which periods from being written in to being read out are overlapping or close to each other on the same row of DRAM, and means for refreshing the row only during the time period from the writing in of the data to the reading out thereof at the end.

A semiconductor circuit which has achieved the first and the second objects is characterized by comprising means for obtaining the memory capacity required by an application using DRAM and storing data in the DRAM in an order starting from a row having longer data retention time, with reference made to a table storing the previously obtained data retention time of each row of DRAM, and means for setting a refreshing cycle time adapted to the row whose data retention time is the shortest of the rows storing data thereon.

In this semiconductor circuit, there may be provided means for disposing data, when it is stored in the DRAM, on specific rows in accordance with the degree of importance of the data.

A semiconductor circuit which has achieved the third object, in each of the above semiconductor circuits, is characterized by comprising means for detecting the temperature of the semiconductor circuit and setting the refreshing cycle of the DRAM according to the temperature.

According to this invention, the following meritorious effects can be obtained:

(1) Since only the rows storing necessary data are refreshed, the number of refreshing operations can be decreased and, hence, reduction in power consumption and prevention of deterioration in the processing performance of the logic circuit caused by contention between refresh and DRAM access can be attained.

(2) Since the rows on which data are written are determined according to the degree of importance of the stored data, the need for excessively shortening the refreshing cycle can be eliminated and, hence, reduction in power consumption and prevention of deterioration in the processing performance of the logic circuit caused by contention between refresh and DRAM access can be attained.

(3) Since the refreshing cycle is set according to temperature, the need for excessively shortening the refreshing cycle can be eliminated and, hence, reduction in power consumption and prevention of deterioration in the processing performance of the logic circuit caused by contention between refresh and DRAM access can be attained.

BRIEF DESCRIPTION OF THE DRAWINGS

FIG. 7 is an explanatory drawing of a second embodiment, of which (a) is a graph showing lifetimes of data in a DRAM, (b) is an explanatory drawing of a case where data are disposed without taking the lifetimes of the data into consideration, (c) is a graph showing lifetimes of data disposed on each row, (d) is an explanatory drawing of a case where data whose lifetimes are similar are disposed on the same row and stored in the DRAM, and (e) is a graph showing the lifetimes of data on each of the rows after the disposition of the data A–H is optimized.

BEST MODE FOR CARRYING OUT THE INVENTION

Figure 1:
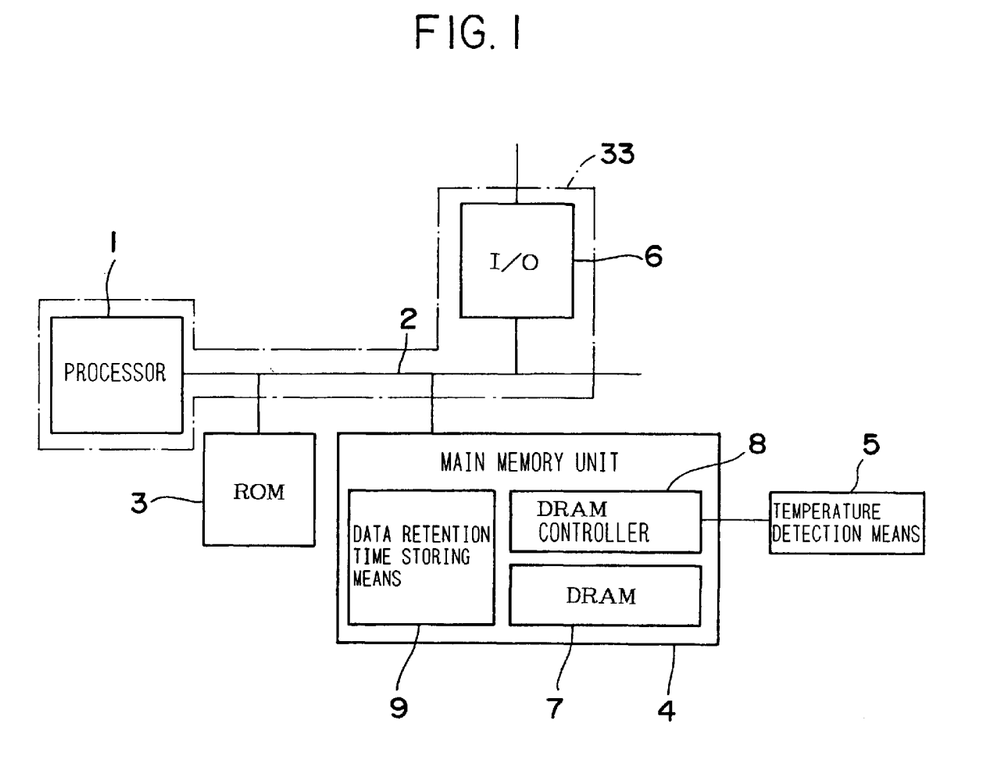
FIG. 1 is a block diagram showing the general configuration of an information processing apparatus to which a semiconductor circuit of the invention is applied.

FIG. 1 is a block diagram showing a general configuration of an information processing apparatus to which the semiconductor circuit of the invention is applied. A processor 1, a ROM 3, a main memory unit 4, a temperature detection means 5, an I/O (input/output interface) 6, and the like are connected by a bus 2. The main memory unit 4 includes a DRAM 7 for storing data, a DRAM controller 8 for controlling write and read operations on the DRAM 7, and a data retention time storing means 9 for storing data retention times of each of the rows in the DRAM 7. Here, a logic portion 33 is constituted of non-memory circuits such as logic circuits, including the processor 1, the I/O 6, and the like.

Figure 2:
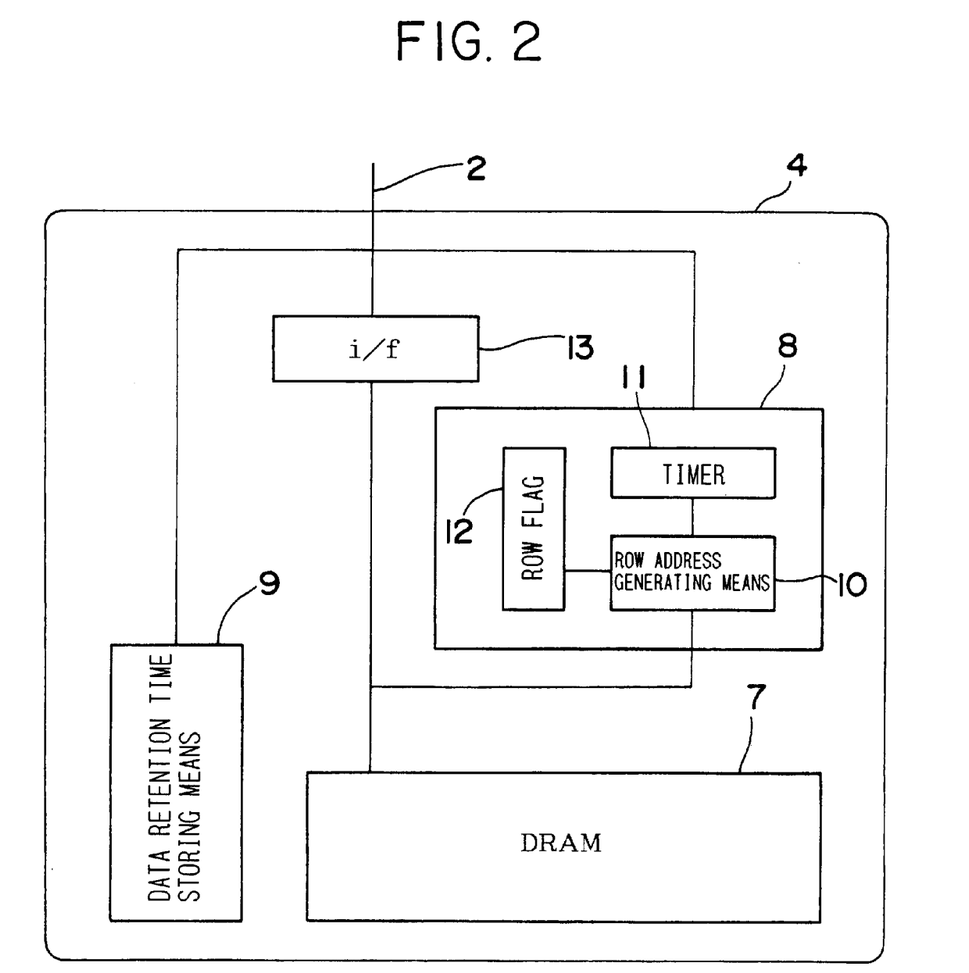
FIG. 2 is a block diagram showing an internal configuration of the main memory unit 4 shown in FIG. 1.

FIG. 2 is a block diagram showing an internal configuration of the main memory unit 4 shown in FIG. 1. The DRAM controller 8 within the main memory unit 4 includes a row address generating means 10 for generating the row address of the row of the DRAM 7, a timer 11 for deciding the timing of generation of the row address, and a row flag storing portion 12 for setting the row as the object of refreshing in the DRAM 7. The DRAM 7 is connected to the bus 2 through the interface (i/f) 13.

One DRAM controller 8 is implemented within the chip of a merged DRAM/logic LSI and performs control of the refreshing operation and the like at all times irrespective of the operation mode of the DRAM.

In a conventional system in which a logic circuit and a DRAM are connected with each other on a print circuit board, there are circuits for separately performing refreshing both outside and inside the DRAM, and they may operate in different cycles depending on the modes (normal mode/sleep mode) of the DRAM. This is the point in which it is different from the DRAM controller in the merged DRAM/logic LSI.

Every time a predetermined time period is counted out by the timer 11 being a component of the DRAM controller 8, the row address generating means 10 outputs a refresh address to thereby update the address of the row. The row flag 12 includes the flags corresponding to each of the rows in the DRAM. The DRAM controller 8 refers to the value of the flag corresponding to the row indicated by the row address generating means 10 every time a predetermined time period is counted out by the timer 11, and carries out a refreshing operation only when the value of the flag is set so that a refreshing operation should be made and, otherwise, it makes no operation. As the predetermined time period, the time obtained by dividing the refreshing cycle time by the number of the rows, for example, is used.

The DRAM controller 8 also has a function to coordinate the contention made between access to the DRAM through the bus 2 and a refreshing operation. Incidentally, the processor 1 and the DRAM 7 within the main memory unit 4 may have a path to connect with each other not by way of the bus 2. In this case, the DRAM controller 8 also performs the coordination of the contention between access to the DRAM through this path and a refreshing operation.

Figure 3:
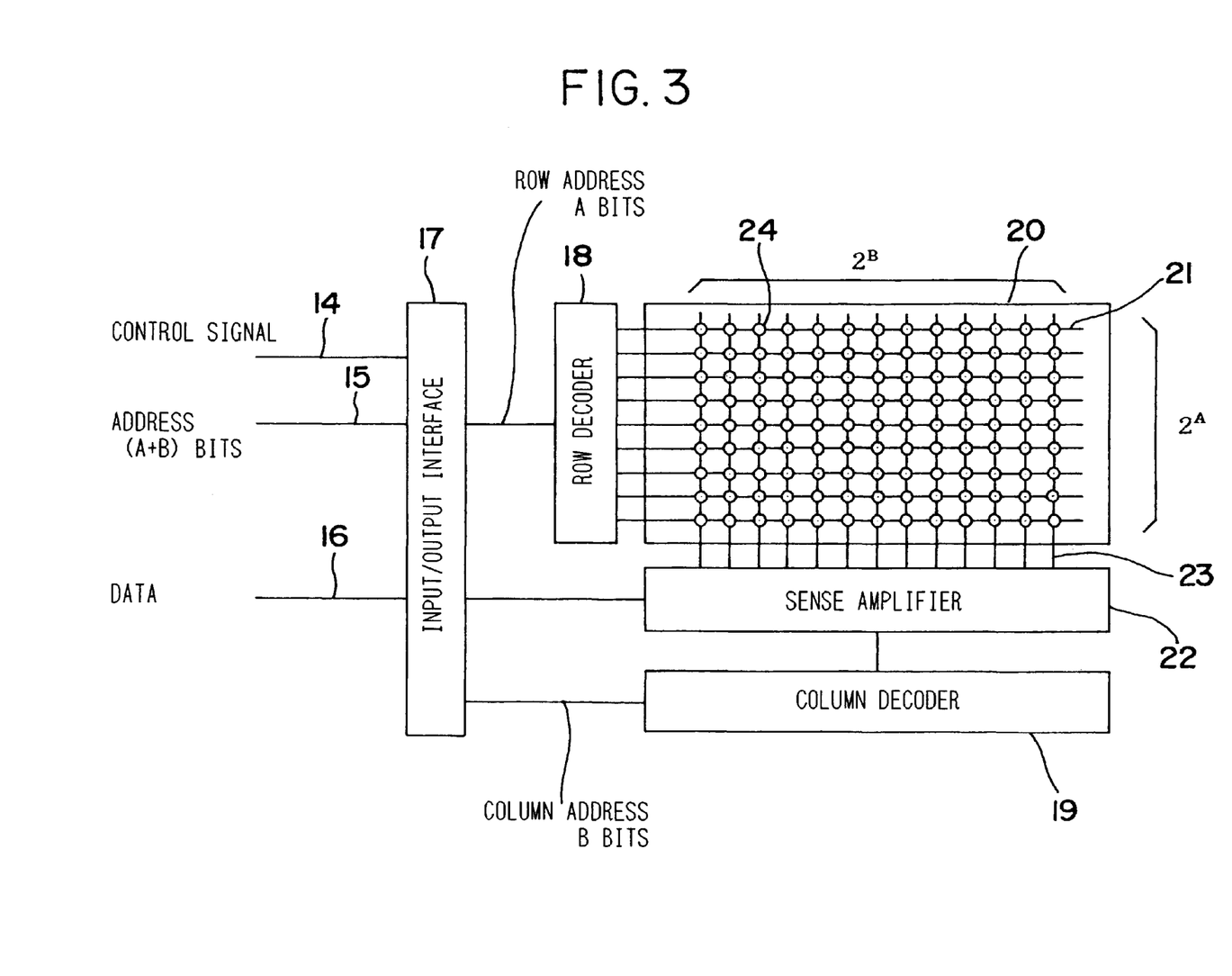
FIG. 3 is a block diagram showing an internal configuration of the DRAM 7.

FIG. 3 is a block diagram showing an internal configuration of the DRAM 7. A control signal line 14 to which a control signal for controlling write and read is supplied, an address line 15 to which an address signal of (A+B) bits is supplied, and a data line 16 to which data is supplied are connected to an input/output interface 17. An address of (A+B) bits is separated by the input/output interface 17 into a row address of A bits and a column address of B bits, of which the row address of A bits is supplied to a row decoder 18 and the column address of B bits is supplied to a column decoder 19. A memory cell 24 is disposed in the vicinity of the intersection of the word line 21 and a bit line 23. The output of the row decoder 18 is supplied to the word line 21 selected from a memory cell array 20 and the data in the memory cells on the selected row is output over $2^B$ pieces of the bit lines 23. Then, a sense amplifier 22 amplifies the data. Further, the data on the bit lines selected by the column decoder 19 are output to outside the main memory unit 4.

In the description above, the size of the column address is in agreement with the number of the bit lines and the minimum amount of data accessible at one time is one bit. The amount of data accessible at one time may be either a predetermined value or a value that is to be determined each time of access by a signal for specifying the size included in the control signal 14. Further, the size of the space which the column address has may be smaller than the number of bit lines. In this case, the minimum amount of data accessible at one time is the value obtained by dividing the number of bit lines by the size of the column address space.

Some control methods used in the above described semiconductor circuit will be described below.

First Embodiment

The basic concept of the control method in the present invention will be described below as compared with the control method in the prior art.

Figure 4:
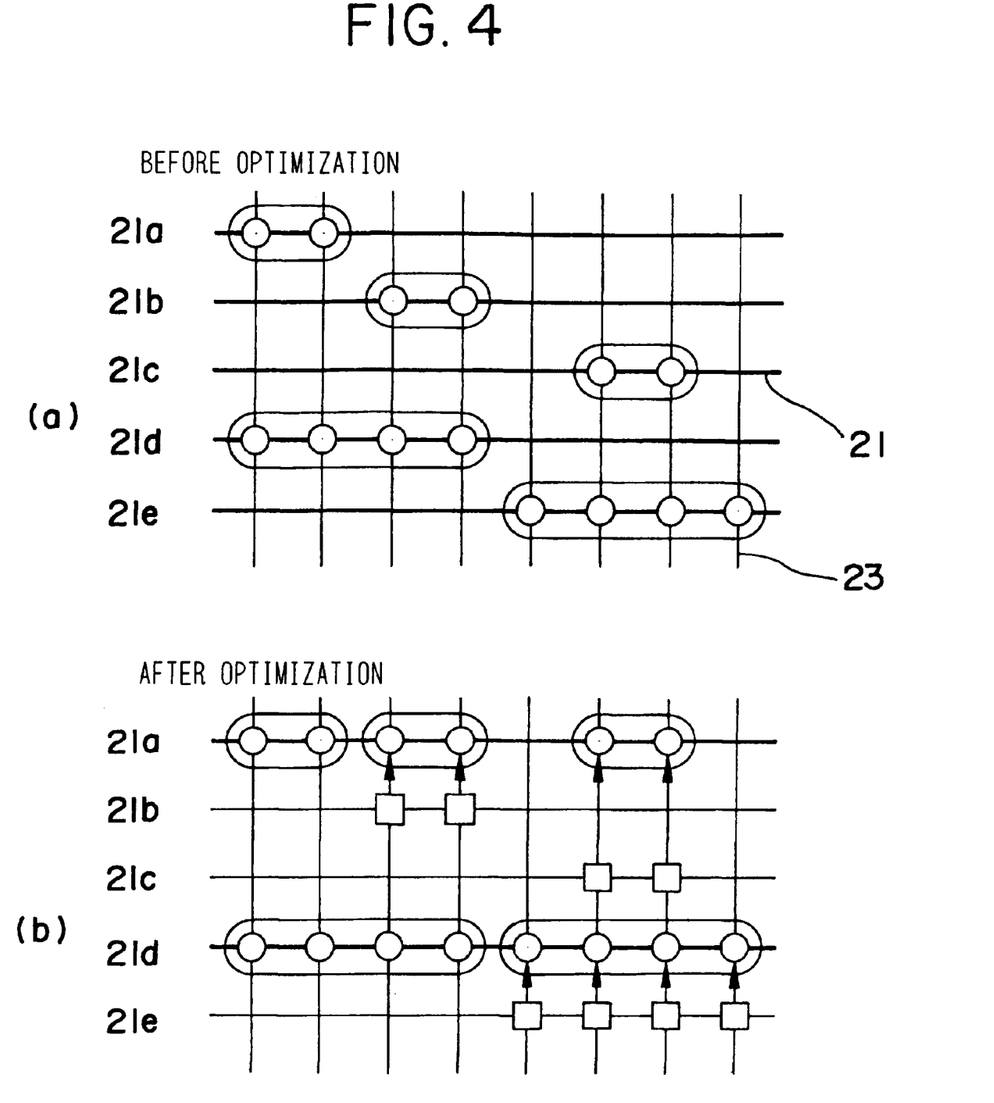
FIG. 4(a) is a diagram showing the relationship between stored positions of data and rows before optimization and FIG. 4(b) is a diagram showing the relationship between stored positions of data and rows after optimization.

FIG. 4(*a*) shows the relationship between the stored position of data and the row when optimization of disposition of data has not been made. Referring to FIG. 4(*a*), the position indicated by the circle shows the position in which data is written and an oval indicates an aggregate of individual data.

FIG. 4(*a*) shows an example where the positions to which the data are allocated are randomly determined. In this example, data are written on each of five rows, which are arranged in succession.

Here in this embodiment, attention is paid to the disposition of data on the DRAM. With respect to the disposition of the data on the memory cells on each row, when the state of overlapping of the data is examined in the direction of the bit line 23, there are no overlaps of data on rows 21*a*, 21*b*, and 21*c* and, also, on rows 21*d* and 21*e*.

Then, the disposition of the data is determined, as shown in FIG. 4(*b*), so that the number of rows storing data thereon decreases while a plurality of data are disposed so as not to overlap each other on the same row. The method to determine the combination of the data allocated to each row with the aim of reducing the number of the rows is solved as a combinatorial optimization problem. In FIG. 4(*b*), rows 21*a* and 21*d* to which data are allocated are indicated by thick lines and rows 21*b*, 21*c*, and 21*e* to which no data are allocated are indicated by thin lines.

Thus, after having data disposed as described above, setting for the control of execution of the refreshing operation is made for each row.

Each field of the row flag 12 corresponds to each row of the DRAM. The DRAM controller 8 determines whether refreshing is to be done or not for each row in accordance with the flag value set in the row flag 12, and performs the refreshing control for the row which is set to be refreshed by the flag. Each flag of the row flag 12 can be realized by one bit (on/off).

As a method for determining data disposition, there is one performed by a compiler and another performed by an operating system.

Figure 5:
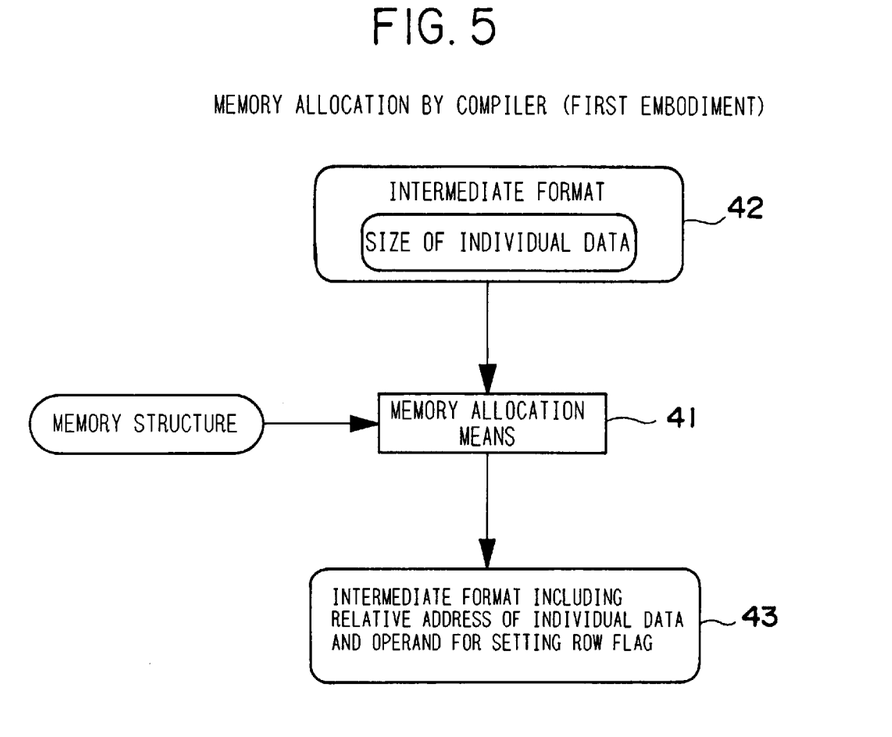
FIG. 5 is a functional diagram showing the principle of memory allocation made by a compiler in a first embodiment.

In the former method performed by the compiler as shown in FIG. 5, the memory allocation optimization process is applied to the intermediate format 42 by the memory allocation means 41 as one of the functions of the compiler. The process for the combinatorial optimization of data is performed to minimize the number of rows to which data are actually allocated, with the number of rows and the number of memory cells on each row, as the structure of the memory, used as constraints to thereby determine relative addresses of individual data. Then, the intermediate format 43 is output with the operation for setting flags, corresponding to rows on which the data are to be stored, inserted therein. The intermediate format 43 is converted into a sequence of instructions in the last step of the compiling process. As a method for actually setting the flag, there is a method which uses an instruction to automatically set/reset the flag for an accessed row, or a method which establishes the value by an immediate instruction or a data transfer instruction.

Figure 6:
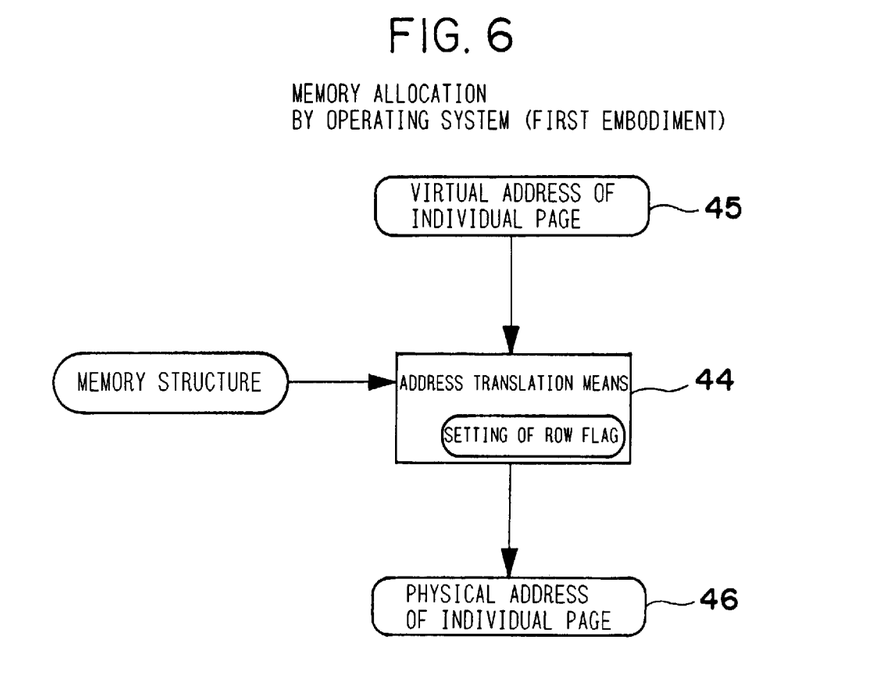
FIG. 6 is a functional diagram showing the principle of memory allocation made by an operating system in the first embodiment.

In the latter method, performed by the operating system as shown in FIG. 6, disposition of pages is determined by the address translation means 44, when it maps the pages represented by the virtual address 45 onto the physical address 46, such that the number of the pages, i.e., the number of the rows to which the data are allocated, is minimized. The setting of the row flag 12 is realized by incorporating an instruction that sets the flag as described above, an immediate instruction, or a data transfer instruction, into the address translation means 43 such that the flag is set for the row on which data are actually mapped.

After the data have been disposed as described above, refreshing operations are carried out only for the rows on which the data are stored, whereby unnecessary refreshing operations can be decreased and both reduction in power consumption and prevention of increase in memory access time due to contention between refresh and memory access can be achieved.

The position in which the compiler or the operating system operates may be either inside or outside the semiconductor circuit, provided that it is able to know the structure of the memory.

Second Embodiment

Now, a control method in which the disposition of data is determined taking note of the lifetime of the data, i.e., the period of time from first writing in of a variable to the reading out thereof at the end.

Figure 7:
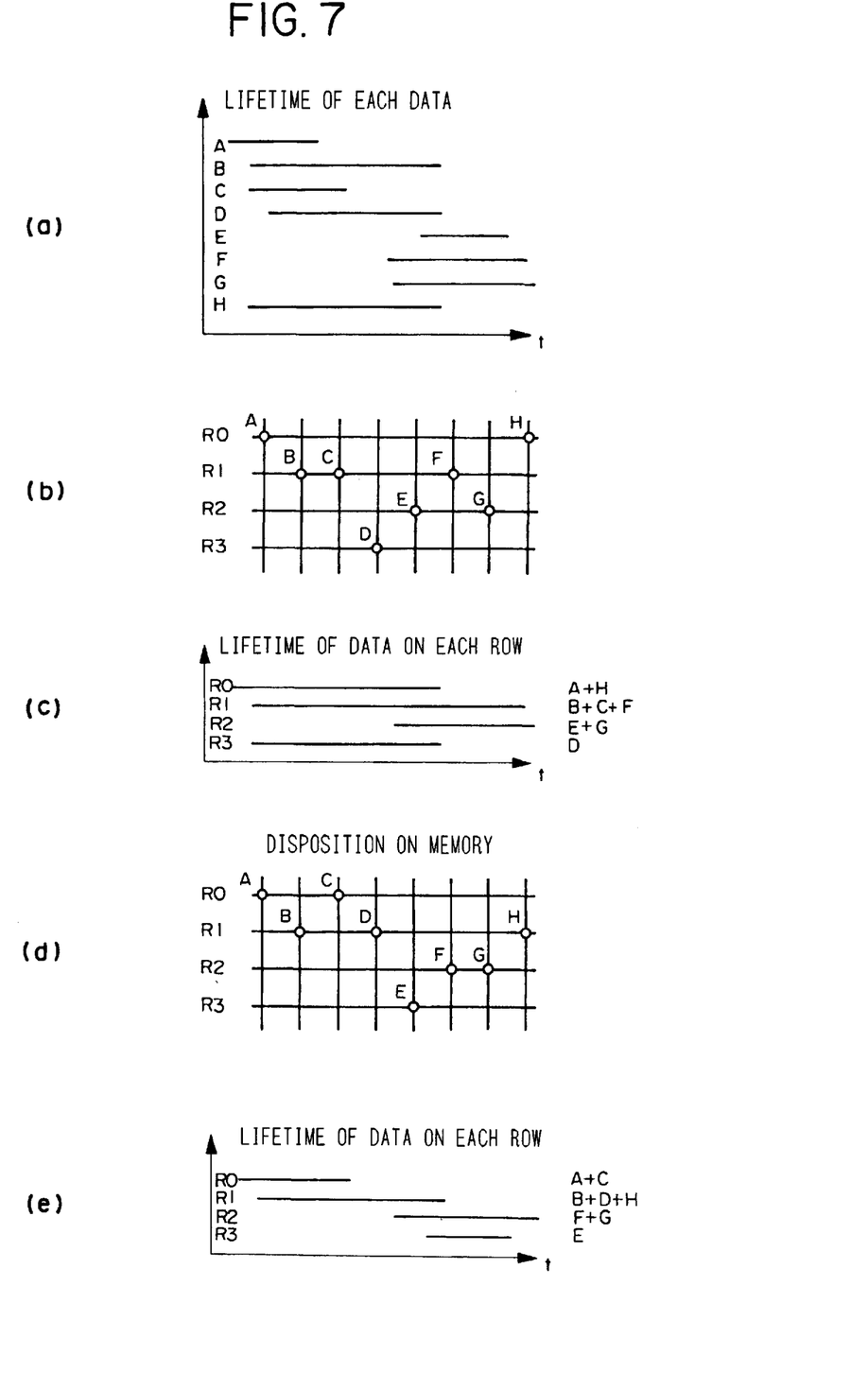

FIG. 7(*a*) is a graph showing lifetimes of data A–H to be stored in a DRAM.

If the data are mapped without considering their lifetimes data whose lifetimes are different will be allocated to the same row as shown in FIG. 7(*b*).

FIG. 7(*c*) is a drawing in which the lifetimes of the data in FIG. 7(*a*) are rearranged for each row. Since, for example, row R1 has data B, C, and F stored thereon, it becomes necessary to constantly refresh row R1 as long as any of data B, C, and F are live.

Therefore, in the present embodiment, as shown in FIG. 7(*d*), attention is paid to the lifetimes of data A–H, and the data are stored so that those having lifetimes close to or overlapping each other are disposed on the same row to be stored in the DRAM. The method for determining the combination of data to be allocated to each row with the aim of minimizing the sum total of the time periods, during which the live data are kept stored on each of the rows, is solved as a combination optimization problem.

In the example shown in FIG. 7(*d*), data A and C are disposed on row R0, data B and D on row R1, data F and G on row R2, and data E on row R3.

FIG. 7(*e*) is a graph showing the lifetimes of the data of each row after the positions, in which data A–H are written, have been altered.

Thus, after allocating the data whose lifetimes are overlapping or close to each other to the same row, the setting for controlling the execution of the refreshing operation is made for each row.

Each field of the row flag 12 is corresponding to each row of the DRAM, and the DRAM controller 8 controls the refreshing operation for the relevant row only during the period set by the flag to indicate that the refreshing operation should be made. Each flag of the row flag 12 is realized by one bit (on/off).

As a method for determining the data disposition, there is one performed by a compiler and another performed by an operating system.

Figure 8:
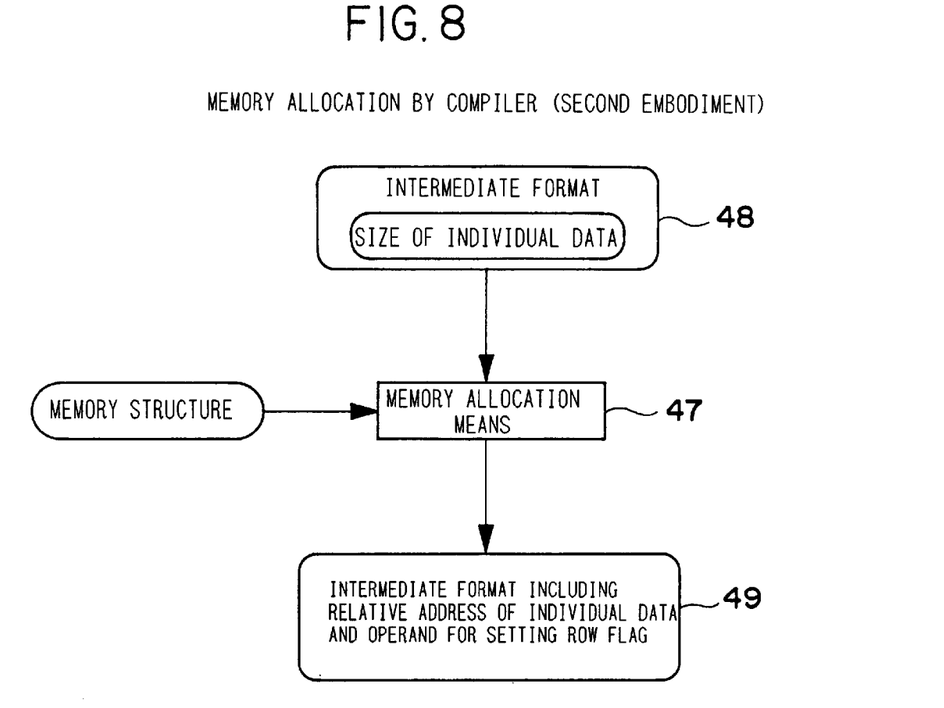
FIG. 8 is a functional diagram showing the principle of memory allocation made by a compiler in the second embodiment.

In the former method, performed by the compiler as shown in FIG. 8, a memory allocation optimization process is applied to the intermediate format 48 by the memory allocation means 47 as one of the functions of the compiler. The memory allocation means 47 obtains the lifetimes of the individual data on the basis of a flow graph as the intermediate format 49. The process for combinational optimization of data is performed to minimize the sum total for all of the rows of the lifetimes of each of the rows where at least a set of data is still live, with the number of rows and the number of memory cells as the structure of the memory used as the constraints, to thereby determine relative address of individual data. Then the intermediate format 49 is output with the operation to set the flag corresponding to the row on which the data is to be stored at the start of the lifetime of the data and the operation for resetting the flag of the row on which the data is stored at the end of the lifetime of the data inserted therein. The intermediate format 49 is converted into a sequence of instructions in the last step of the compiling process. As a method for actually setting the flag, there is a method which uses an instruction to automatically set/reset the flag for an accessed row or a method which establishes the value by an immediate instruction or a data transfer instruction.

Figure 9:
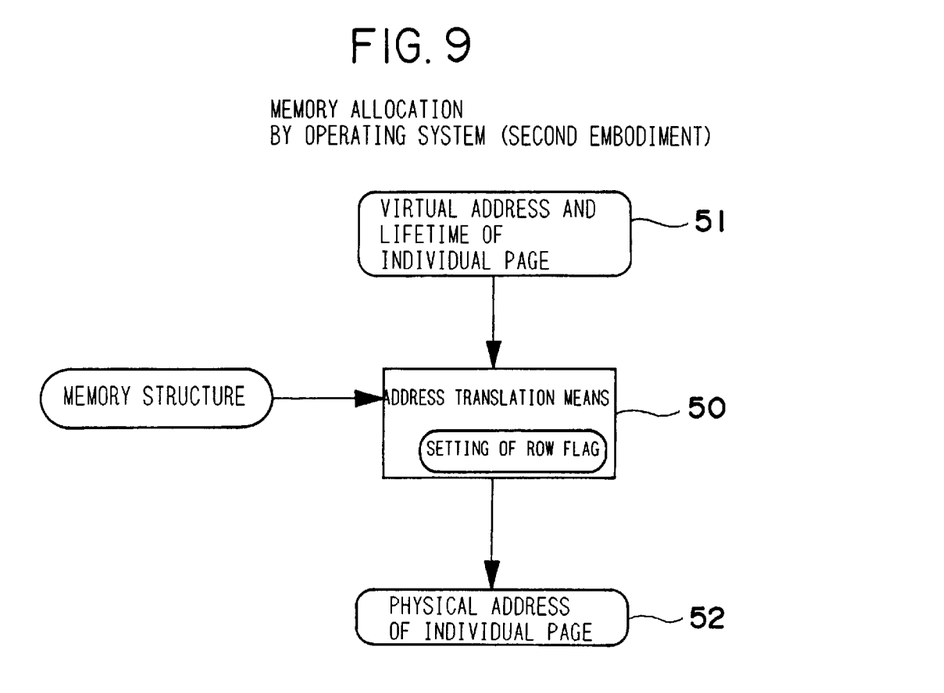
FIG. 9 is a functional diagram showing the principle of memory allocation made by an operating system in the second embodiment.

In the latter method, performed by the operating system as shown in FIG. 9, disposition of pages is determined by the address translation means 50, when it maps the pages represented by the virtual address 51 onto the physical address 52 so that the sum total, for all the rows, of the lifetimes for each of the rows where at least one page is live is minimized, with the number of the rows and the number of the memory cells, as the structure of the memory used as the constraints. The lifetime of each page is given, when the page includes at least one set of data, by the time period during which the data is live, and it can be obtained by the compiler by analyzing the lifetime of each individual datum when it allocates the data to each page. The setting of the flag when the page is disposed on the physical memory and the resetting of the flag when the physical memory is released can be realized by incorporating a flag setting instruction, an immediate instruction, a data transfer instruction, or the like, as described in the first embodiment, into the address translation means 50.

After the data have been disposed as described above, refreshing operations are carried out for the rows storing data only for the time period during which the data is live, whereby unnecessary refreshing operations can be decreased, power consumption reduced, and increase in the memory access time due to contention between refresh and memory access prevented.

The method of optimization in the temporal domain as described in the second embodiment above and the method of optimization in the spatial domain as described in the first embodiment may be practiced at the same time.

The compiler or the operating system may work either at inside or outside the semiconductor circuit provided that it is able to know the structure of the memory.

Third Embodiment

A control method for determining the disposition of data, with attention paid to the data retention time of each of the rows of a DRAM, will be described.

Figure 10:
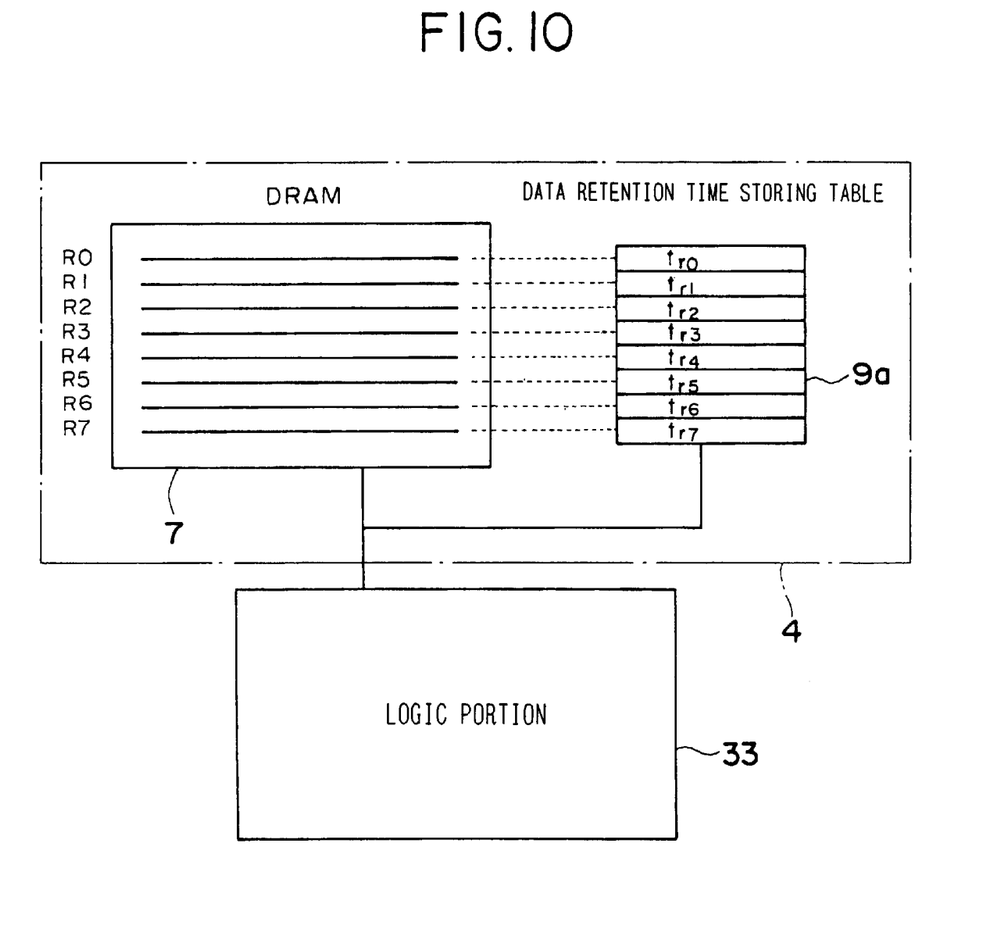
FIG. 10 is a block diagram of an embodiment where a data retention time storing table is provided in a third embodiment.

In this example, there is provided, as schematically shown in FIG. 10, the data retention time storing table 9a storing the data retention times tr0–tr7 on each of a plurality of rows R0–R7 of the DRAM 7.

The storing table 9a corresponds to the data retention time storing means 9 shown in FIG. 1 and can be realized by a device which can be written onto such as a PROM, an EPROM, a FLASH memory, or an FPGA. On the table 9a, there is stored, for each row, the data retention time of the memory cell which has the shortest data retention time among all of the memory cells included in the row.

The measurement of the data retention time is carried out when the DRAM is tested. The results of the measurement are stored on the storing table 9a. The information stored in table 9a, as the data retention time may be the time itself, or an encoded value which is divided by some value.

When the times are divided by rank, an advantage is obtained in that the size of the table can be decreased.

When data are stored in a main memory unit 4, the data retention times of each of the rows stored on the storing table 9a are referred to and the data are stored in order from the row having the longer data retention time. Then, the refreshing cycle time adapted to the shortest data retention time of the row on which data has actually been stored is set in the timer 11.

Upon setting of the timer 11 as described above, setting for controlling the execution of refreshing is made for each row.

Each field of the row flag 12 corresponds to each row of the DRAM. The DRAM controller 8 determines whether refreshing is to be made or not for each row in accordance with the flag value set in the row flag 12 and performs the control of refreshing of the row which is set by the flag to be refreshed. Each flag of the row flag 12 can be realized by one bit (on/off).

As a method for determining the data disposition, there is one performed by a compiler and another performed by an operating system.

Figure 11:
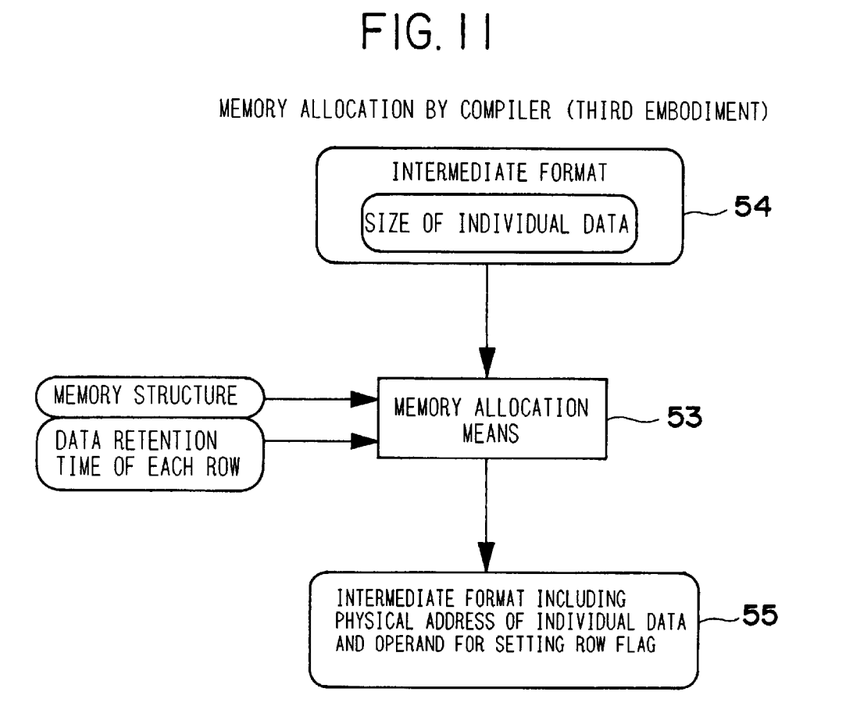
FIG. 11 is a functional diagram showing the principle of memory allocation made by a compiler in the third embodiment.

In the former method performed by the compiler as shown in FIG. 11, a process of memory allocation optimization is applied to the intermediate format 54 by the memory allocation means 53 as one of the functions of the compiler. When data are allocated to the memory, the values stored on the storing table 9a are referred to and the physical address corresponding to the row having the longer data retention time is preferentially taken as the object of data allocation, with the number of rows and the number of memory cells as the structure of the memory used as the constraints. Then, referring to the data retention time of the row which was taken lastly as the object of allocation, the refresh cycle time to be set in the timer 8 is determined. Finally, the intermediate format 55, including the operation to set the flag for the row on which actual data is to be stored and the operation to set the refreshing cycle time, is output. The intermediate format 55 is converted into a sequence of instructions in the last step of the compiling process. As a method for actually setting the flag, there are two methods. One is to use an instruction to automatically set/reset the flag for an accessed row, the other is to establish the value by an immediate instruction or a data transfer instruction.

Figure 12:
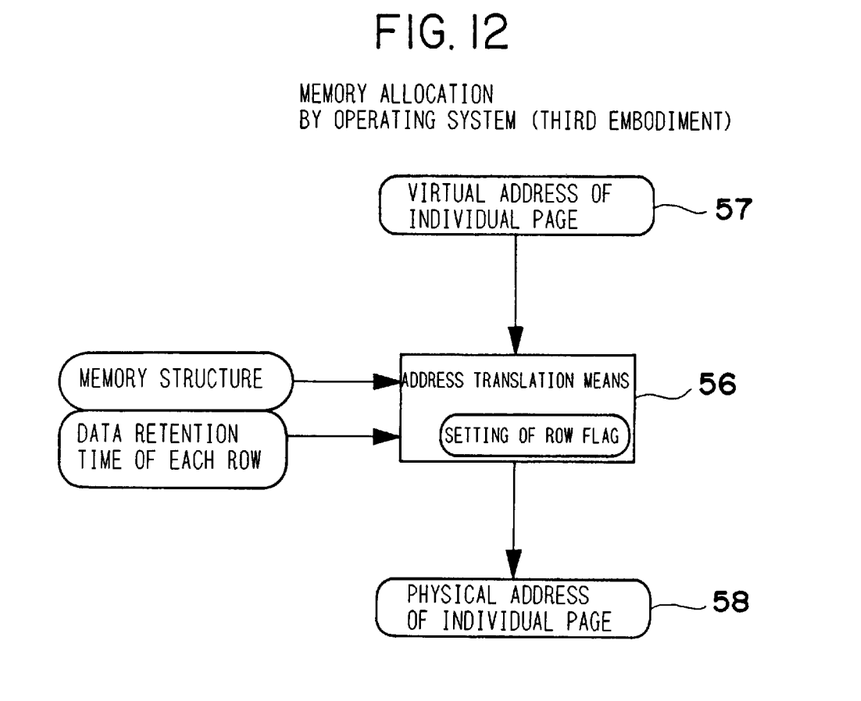
FIG. 12 is a functional diagram showing the principle of memory allocation made by an operating system in the third embodiment.

In the latter method, performed by the operating system as shown in FIG. 12, when a page represented by the virtual address 57 is mapped onto the physical address 58 by the address translation means 56, the row having the longer data retention time is preferentially taken as the object of allocation of the page, i.e., the data, with the number of rows and the number of memory cells on each row as the structure of the memory taken as the constraints. Then, reference is made to the data retention time of the row lastly taken as the object of allocation and the refreshing cycle time is set in the timer 8 and thus the method can be realized. The setting of the flag and the refreshing cycle time is realized by incorporating an instruction, such as a flag setting instruction, an immediate instruction, or a data transfer instruction, as described in the first embodiment, into the address translation means 56.

Thus, by using the rows preferentially from those having longer data retention time, the number of the refreshing operations can be decreased, power consumption reduced, and increase in the memory access time due to contention between refresh and memory access prevented.

It is also possible to use a method for determining the disposition of data by taking note of the data retention time of each row as described in the third embodiment in parallel with the method for optimization in the spatial domain as described in the first embodiment and the method for optimization in the temporal domain as described in the second embodiment.

The position in which the compiler or the operating system operates may be either inside or outside the semiconductor circuit provided that it is able to know the structure of the memory.

Fourth Embodiment

A method by which disposition of data, when the data are stored in a DRAM, is determined in accordance with the degree of importance of the data will be described.

In the data to be stored in the DRAM, there are, for example, those that can be corrected for error, such as communication packets, and those that cannot be corrected for error.

There are also those data that allow for no error produced therein such as those for numerical calculation and control purposes, whereas there are those that cause no serious inconvenience even if some error is present therein such as picture/voice data.

Therefore, the rows to store data thereon are determined according to the degree of importance of the data. Namely, those data which can be corrected for error or those data which allow for some error present therein are allocated to rows that have shorter holding times. On the other hand, those data which cannot be corrected for error or those data which allow for no numerical error present therein are allocated to such rows that have longer data retention times. Thus, by disposing data according to the degree of importance of the data thereby suitably prolonging the cycle time of refreshing, the frequency of the refreshing operation s can be decreased.

Figure 13:
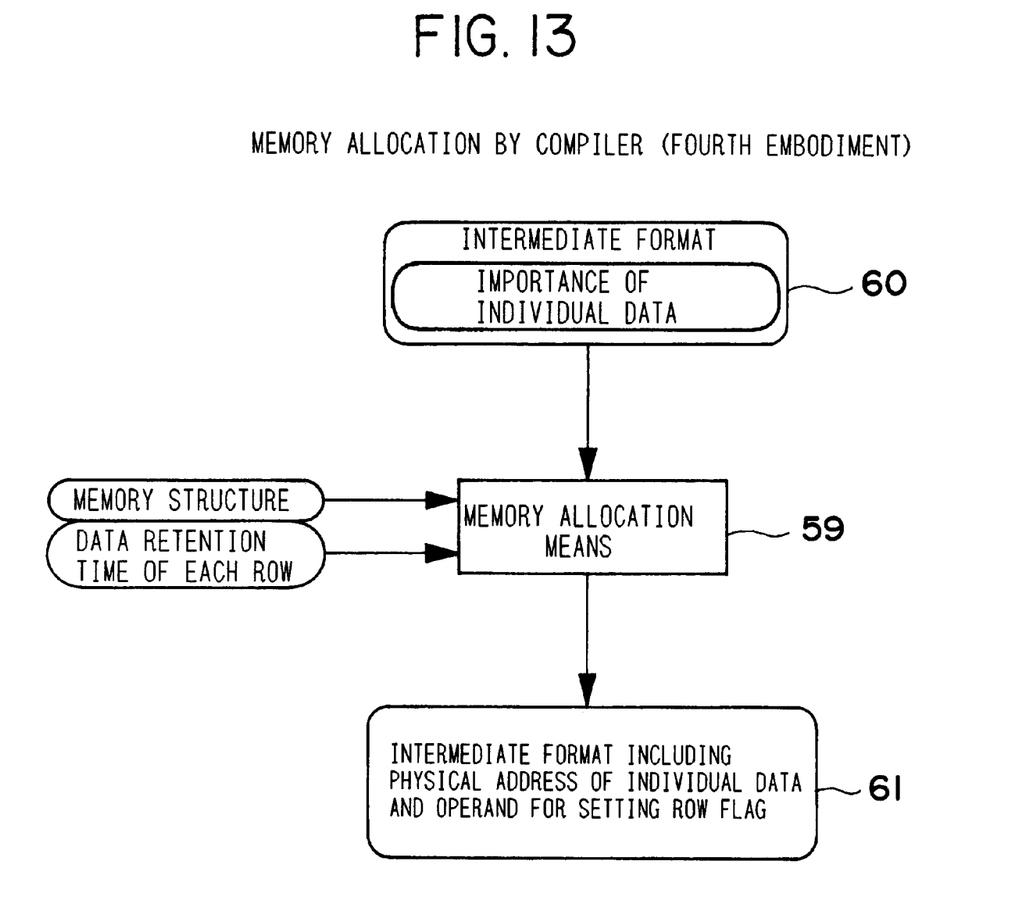
FIG. 13 is a functional diagram showing the principle of memory allocation made by a compiler in a fourth embodiment.

The determination of the disposition of the data according to their degree of importance can be achieved, as shown in FIG. 13, by a compiler corresponding to the intermediate format 60 having a function indicative of the degree of importance of the data. The degree of importance of the data can be described in a program by for example the provision of types showing the degrees of importance. The memory allocation means 59 of the compiler shown in FIG. 13, making reference to the data retention time of each row stored in the data retention time storing means 9, disposes data on the intermediate format 60 in accordance with the degree of importance of the data, determines the physical address of individual data, and outputs the intermediate format 61. The intermediate format 61 is converted into a sequence of instructions in the last step of the compiling process.

The position in which the compiler operates may be either inside or outside the semiconductor circuit provided that it is able to know the structure of the memory.

Fifth Embodiment

It is a characteristic of ordinary DRAM that the data retention time of each row is not stationary, but variable with the temperature. Namely, as described above, the lower the temperature, the longer the data retention time. The interval between the refreshing operations of a conventional DRAM is generally set to be very short assuming the worst operating condition, namely a high-temperature condition. However, since the actual data retention time at normal temperatures is great, the refreshing cycle time adapted to the high-temperature condition becomes very short as compared with the actual data retention time, which means that excessive refreshing is then being practiced.

Thus, not only is electric power overly is consumed, but average memory access time increases, because of the more frequent contention occurring between refresh and memory access and, thereby, the performance of the logic portion 33 merged with the DRAM 7 deteriorates.

Figure 14:
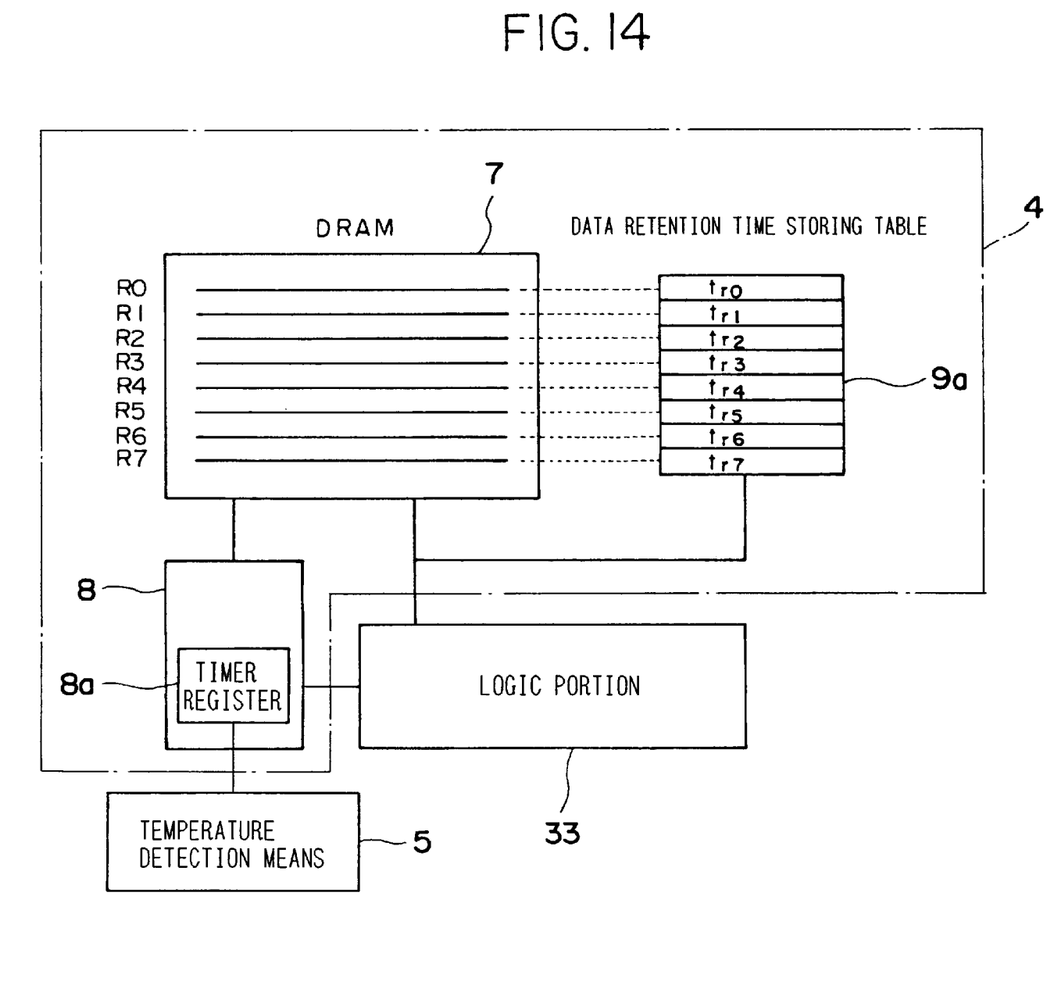
FIG. 14 is a block diagram of a fifth embodiment provided with a means for detecting temperature and a means for controlling the refreshing cycle time.

Therefore, in the embodiment shown in FIG. 14, the semiconductor circuit formed of the DRAM 7 and the logic portion 33 merged on a chip is provided therein with the temperature detection means 5 for detecting the temperature of the semiconductor circuit. Thus, by controlling the timer register 8a of the DRAM controller 8 according to the temperature, the refreshing cycle time is suitably set.

The temperature detection means 5 can be realized by a method in which a leakage current of a memory cell having the same temperature characteristic as the memory cell for actually storing data is monitored, a method in which a ring oscillator is used, or the like (1994. Ito, "VLSI Memory", Baifukan).

Thus, by setting the refreshing cycle time upon detection of the temperature, thereby decreasing the frequency of the refreshing operations, execution of unnecessary refreshing in the DRAM/logic hybrid LSI can be decreased and, thereby, both reduction in power consumption and prevention of increase in the access time due to contention between refresh and memory access can be achieved.

It is also possible to use the method as described in the fifth embodiment, in which the refreshing cycle time is set upon detection of the temperature, in parallel with the method of optimization in the spatial domain as described in the first embodiment, the method of optimization in the temporal domain as described in the second embodiment, and the method for determining the disposition of data in accordance with the data retention time as described in the third and fourth embodiments.

INDUSTRIAL APPLICABILITY

The invention can be utilized in the field of the semiconductor circuits employing DRAM.

What is claimed is:

1. A method of controlling a semiconductor circuit including a DRAM comprising the steps of:

writing data by determining interleaved combinations of data, of at least two rows, allocatable respectively to individual rows so that a number of rows of the DRAM storing the data thereon is reduced; and selectively refreshing said rows based on storage of the data thereon.

2. A method of controlling a semiconductor circuit including a DRAM comprising the steps of:

writing data, having time periods from being written in to being read out, on a common row of said DRAM based on at least one of overlapping and proximity of the time periods to each other; and refreshing said common row only during the time period from the first writing in of the data to the last reading out thereof.

3. A method of controlling a semiconductor circuit including a DRAM comprising the steps of:

obtaining a memory capacity required by an application using said DRAM and writing, in turn, data in said DRAM in an order from a longer data retention time row to a shorter data retention time row with reference to a table having previously obtained data retention time of each row of said DRAM; and setting a refreshing cycle time on the basis of a row having the shortest data retention time of the rows to which data is stored to reduce the refreshing cycle time.

4. A method of controlling a semiconductor circuit according to claim 3, wherein the step of writing data includes writing the data on specific rows in accordance with a degree of importance of the data.

5. A method of controlling a semiconductor circuit according to claims 1 or 2, further comprising the step of detecting a temperature of said semiconductor circuit and setting a refreshing cycle time of said DRAM according to the temperature.

6. A semiconductor circuit including a DRAM characterized by comprising:

a unit for writing data so that a number of rows of the DRAM storing data thereon is reduced; and a selective refreshing unit for selectively refreshing said rows based on storage of the data thereon, whereby rows absent data are not refreshed.

7. A semiconductor circuit including a DRAM comprising:

a unit for writing data, having time periods from being written in to being read out on a common row of said DRAM based on at least one of overlapping and proximity of the time periods to each other; and a refreshing unit for refreshing said common row only during the time period from the first writing in of the data to the last reading out thereof.

8. A semiconductor circuit including a DRAM comprising:

a unit for obtaining a memory capacity required by an application using said DRAM and writing, in turn, data in said DRAM in an order from a longer data retention time row to a shorter data retention time row with reference to a table having the previously obtained data retention time of each row of said DRAM; and a unit for setting a refreshing cycle time on the basis of a row having the shortest data retention time of the rows to which data is stored to reduce the refreshing cycle time.

9. A semiconductor circuit according to claim 8, wherein the unit for writing data includes a unit for writing data on specific rows in accordance with a degree of importance of the data.

10. A semiconductor circuit according to claims 6 or 7, further comprising a unit for detecting a temperature of said semiconductor circuit and setting a refreshing cycle time of said DRAM according to the temperature.

* * * * *